United States Patent [19]

Koblitz et al.

[11] Patent Number: 4,935,454

[45] Date of Patent: Jun. 19, 1990

[54] BROAD SPECTRUM LIGHT AND HEAT CURABLE SEALANT COMPOSITION AND METHOD OF USING SAME

[75] Inventors: Francis F. Koblitz; Thomas M. O'Shea, both of York; Lynn K. Snyder, Spring Grove, all of Pa.

[73] Assignee: AMP Incorporated, Harrisburg, Pa.

[21] Appl. No.: 353,218

[22] Filed: May 16, 1989

Related U.S. Application Data

[63] Continuation of Ser. No. 912,026, Sep. 26, 1986, abandoned, which is a continuation-in-part of Ser. No. 750,450, Jul. 1, 1985, abandoned.

[51] Int. Cl.$^5$ .................................................. C08F 2/50
[52] U.S. Cl. .................................. 522/24; 522/92; 522/96; 522/103; 204/157.69
[58] Field of Search .................... 522/103, 92, 96, 24

[56] References Cited

U.S. PATENT DOCUMENTS

| | | | |
|---|---|---|---|
| 2,883,308 | 4/1959 | Yamada et al. | 339/278 C |
| 3,458,351 | 6/1964 | Held et al. | 427/58 |
| 3,725,230 | 3/1971 | Bahder et al. | 427/44 |
| 3,770,602 | 11/1973 | D'Alelio | 427/44 |
| 3,882,003 | 5/1975 | Mani | 427/44 |
| 3,912,608 | 10/1975 | Marans et al. | 427/44 |
| 4,028,204 | 6/1977 | Rosen et al. | 427/44 |
| 4,113,893 | 9/1978 | Hahn | 427/44 |
| 4,156,035 | 5/1979 | Tsuo et al. | 522/103 |
| 4,187,257 | 2/1980 | Nielsen | 522/103 |
| 4,200,705 | 4/1980 | Davis | 522/103 |
| 4,273,802 | 6/1981 | Kamada et al. | 427/44 |
| 4,368,300 | 1/1983 | Nakano et al. | 522/103 |
| 4,424,252 | 1/1984 | Nativi | 427/44 |
| 4,481,258 | 11/1984 | Sattler et al. | 522/103 |
| 4,494,825 | 1/1985 | Sasaki et al. | 522/103 |

*Primary Examiner*—Bernard Lipman
*Attorney, Agent, or Firm*—Katherine A. Nelson

[57] ABSTRACT

A dielectric composition capable of being polymerized for use in sealing electrical and electro-optical connectors and devices is disclosed. Said composition is comprised of a major proportion of vinyl ester resins, a minor proportion of polymerizable acrylic diluent monomers, and a polymerization activation system comprised of from about 0.25 percent to about 17 percent by weight of the resin. A process of the present invention includes applying a layer of said composition to desired areas or to desired locations such as apertures surrounding electrical terminals extending from a connector housing, and exposing said composition to actinic radiation which activates the polymerization activation system which causes the composition to polymerize to form a sealant material that exclused solder and solvents from the connector and its apertures.

12 Claims, 1 Drawing Sheet

4,935,454 ized and closely spaced terminals it is especially impor-
BROAD SPECTRUM LIGHT AND HEAT CURABLE SEALANT COMPOSITION AND METHOD OF USING SAME This application is a continuation of application Ser. No. 07/912,026 filed Sept. 26, 1986, now abandoned, in turn, a continuation-in-part of 750,450 filed July 1, 1985 now abandoned.

FIELD OF THE INVENTION

This invention relates to curable sealant compositions and more particularly to photocurable and/or thermally curable sealant compositions used to seal electrical connectors and components thereof.

BACKGROUND OF THE INVENTION

Various sealant compositions have been used to seal electrical connectors and protect the terminals within the connectors particularly when the connectors must be soldered to a substrate. Typically the procedures for mounting components to a substrate involve exposure to fluxes, solder, defluxing agents and cleaning agents. It is important that the chemicals and especially solder used during these processes do not migrate or wick into the connector housing, damage the terminals, and prevent the connector from being mated with a corresponding connector. With the increased use of miniaturized and closely spaced terminals it is especially important to prevent wicking of solder into the terminals. Even a minute amount of solder in terminals having a contact opening with a diameter on the order of 0.025 inches will prevent the terminal from proper electrical engagement when the connector is mated with a corresponding connector. Electro-optic devices and components of connectors, such as filters, and the like, frequently require sealants in the form of coatings and adhesives.

It is known to the art to seal connectors using anaerobic acrylate adhesives, epoxy resin adhesives, and cyanoacrylate adhesives. There are problems associated with using these sealants in sealed connectors owing to lack of heat resistance at elevated soldering temperatures and lack of resistance to cleaning chemicals.

It is an object of this invention to provide a sealant which is hydrophobic, will withstand soldering procedures and is resistant to corrosive cleaning solvents.

It is an additional object of the invention to provide a sealant for repairing and sealing electrical connector housings, components of connectors, and electro-optic devices, for filling joint gaps and also especially apertures around terminals and strengthening thereat the housing, components and devices against physical stresses.

It is also an object of this invention to provide a solder resistant sealant for use with electrical devices, such as filters and the like, having a plurality of isolated conductive areas thereon wherein one or more of the conductive areas must be soldered to other conductive areas.

Furthermore, it is an object of the invention to provide a solder and chemical resistant sealant for selected locations or areas of electrical devices that will protect and seal those locations during the life of the device.

In addition, it is an object of the invention to provide a cost effective means for sealing electrical components that is also usable in automated manufacturing systems.

It is a further object of the invention to provide a sealant which is curable by actinic radiation, particularly ultraviolet and visible light, or heat.

In addition, it is an object of the invention to provide a sealant which has a dual curing system specifically designed for combined photocuring and heat curing.

It is also an object of the invention to provide a sealant which will adhere well to plastics, metals, glass, and semiconductors such as ferrites and titanates.

Still further, it is an object of the invention to provide a process for sealing electrical connectors, components of connectors, and electro-optic devices.

Additionally, it is an object of this invention to provide a process to seal, repair and structurally reinforce foraminous electrical and electro-optical connectors.

SUMMARY OF THE INVENTION

The invention is directed to a curable sealant composition and process for sealing electrical connectors and, in particular, to curable sealants that are completely curable by either light or heat or a combination thereof. The sealant composition is comprised of a major proportion of a polymerizable vinyl ester resin, a minor proportion of a polymerizable acrylic diluent monomer, and a polymerization activation system comprising from about 0.25 percent to about 17 percent by weight of the resin. The composition is applied to desired areas of an electrical connector, primarily to the areas surrounding the apertures where the terminals exit the housing. In the preferred embodiment the composition is initially cured by exposure to ultraviolet light to polymerize the composition so that it will not flow into the interior of the connector and subsequently postcured by heating.

Some of the objectives and advantages of the invention having been stated, others will appear as the description proceeds when taken in connection with the accompanying drawings.

DESCRIPTION OF THE PREFERRED EMBODIMENT

Figure 1:
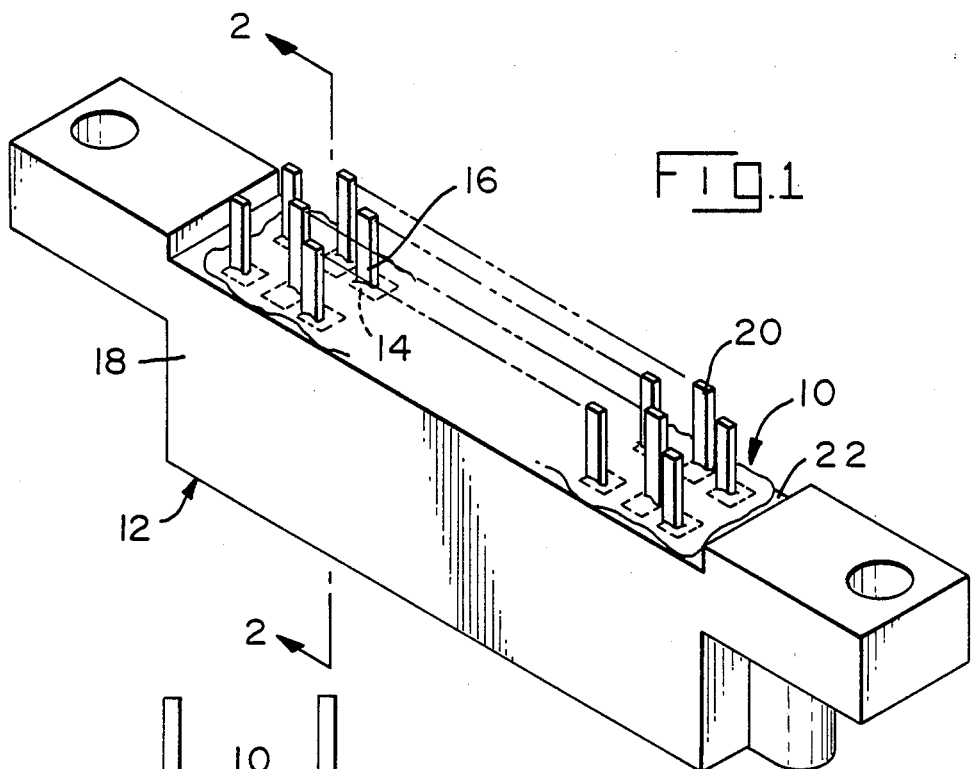
FIG. 1 is a perspective view of a box connector illustrating the invention disclosed herein.

The sealant composition is comprised of from about 45 to about 80 percent, preferably 55 to 70 percent of at least one polymerizable vinyl ester resin; from about 10 to about 50 percent, preferably 15 to 40 percent of at least one polymerizable acrylic diluent monomer; and from about 0.25 to about 20 percent, preferably 1 to 15 percent by weight of the resin of a polymerization activation system. The percentage of the activation system depends upon the type of system used. For example, from 1 to about 6 percent of a photoinitiating system, from 1 to 3 percent of a thermoinitiating system or from 1 to 15 percent of a chain transfer system may be used. From about 0.01 to about 0.5 percent and preferably 0.1 to 0.3 percent of a stabilizer may be added. From 0 to about 10 percent, preferably 3 to 7 percent of fumed silica may also be added to control the viscosity of the mixture. Hydrophobic fumed silica may be used to provide enhanced resistance to high humidities.

The vinyl ester resin used in the preferred embodiment is 2,2-bis[4-(2-hydroxy-3-acryloxypropoxy)-phenyl]-propane, commonly referred to as the reaction product of "Bisphenol A" diglycidyl ether with acrylic acid. "Bisphenol A" is commonly used in the art to indicate the chemical compound, 2,2-bis(4-hydroxyphenyl)-propane.

The vinyl ester resin is available from Cargill, Inc., Carpentersville, Ill., under the trade name Epoxy Acrylate Resin 1570. The resin is also available from Radcure Specialties, Inc., Port Washington, Wis., under the trade name Ebecryl 600, Shell Chemical Company, Houston, Tex., under the trade name Epocryl 370, and from Diamond Shamrock Chemicals Company, Morristown, N.J., under the tradename Photomer 3016 and from Celanese Specialty Resins, Louisville, Ky., under the trade name CELRAD 3700.

The diglycidyl methacrylate of "Bisphenol A", which is 2,2-bis[4-(2-hydroxy-3-methacryloxypropoxy)-phenyl]-propane, is also usable, particularly when the curing is effected by visible light of 400 to 550 nanometers wavelength. It is available from Freeman Chemical Corporation, Port Washington, Wis., under the trade name NUPOL 46-4005. Acrylate esters of liquid epoxy resins may also be used. They are available from Cargill, Inc. under the trade name Epoxy Acrylate Resin 1572 and 1573.

It should be understood that the term "vinyl ester resin", is used generically herein to designate polymerizable oligomeric organic compounds which may be used singly or in combination. This includes polymerizable oligomers referred to in the trade as acrylated epoxy resins and acrylated urethane resins such as Uvithane 782 and 786 available from Morton Thiokol Company, Carstab Corp., Reading, Ohio 45215.

The polymerizable acrylic diluent monomer used in the preferred embodiment is triethylene glycol dimethacrylate available from Sartomer Co., West Chester, Pa. under the trade name SR-205, from Aldrich Chemical Corp., Milwaukee, WI, and from Polysciences, Inc., Warminster, Pa. Other acrylic diluent monomers include the tetraethylene glycol dimethacrylate available from Sartomer Co. Under the trade name SR-268, tripropylene glycol diacrylate available from Diamond Shamrock Chemicals Co. under the trade name Photomer 4061, allyl-methacrylate, 1-vinyl-2-pyrrolidinone, dipentaerythritol monohydroxypentaacrylate, 1,6-hexanadiol diacrylate and trimethylol propane trimethacrylate also available from Sartomer. Other diluent monomers include, for example, triethylene glycol diacrylate, and tripropylene glycol dimethacrylate, methacrylic acid and allyl methacrylate, which are readily available. The diluent monomer is used to control the viscosity and application properties of the material so that the admixture will flow, wet substrates, and polymerize more rapidly than will the resin alone. It is also used to provide additional chain crosslinking to enhance temperature and solvent resistance.

It should be understood that the term "acrylic diluent monomer", is used generically to designate polymerizable mono- and multifunctional monomers. For example, it encompasses allyl and vinyl functionalities.

Non-polymerizable resinous components are used in the preferred embodiment to enhance adhesion to substrates and to control the flow behavior of the composition. A polyester resin component trade named Vitel VPE-5833 is available from Goodyear Tire and Rubber Co., Akron, Ohio.

The photoinitiator system in the preferred embodiment is comprised of one or more compounds which will cause polymerization under ultraviolet light, visible light and/or heat. Agents for curing under ultraviolet light are: benzophenone and benzoin ethers (methyl, ethyl, and isobutyl), available from Aldrich Chemical Company, Milwaukee, Wis. and 2,2-dimethoxy-2-phenylacetophenone referred to hereinafter as 651 and 1-hydroxycyclohexyl phenyl ketone referred to hereinafter as 184, available from Ciba-Geigy, Ardsley, N.Y. under the trade names Irgacure 651 and Irgacure 184 respectively. One photoinitiator for visible light is 2,3-bornanedione or d,l-camphoroquinone referred to hereinafter as CG, available from Aldrich Chemical Co., Milwaukee, Wis. It is to be understood that other photoinitiators activated by actinic light such as 1,4-naphthoquinone benzoquinone and N-methyldiethanolamine may also be used. It is also to be understood that interactive compounds may be used to enhance the generation of curing species, known as polymerization copromoters. Among these are copper and cobalt salts and chelates such as copper 2,4-pentanedionate and cobalt octoate and amines such as triethanolamne and N-methyldiethanolamine referred to hereinafter as MDEA, available from Aldrich Chemical Co. Surprisingly, and contrarily to prior teachings, certain combinations of ultraviolet photoinitiators with monomers and chain transfer agents may effect thermal and visible light polymerizations without the presence of agents commonly employed in the art. Among these combinations are pentaerythritol tetra-(3-mercapto-proprionate), referred to hereinafter as PETMP, plus 651 or 184.

It is essential that the polymerization activation system be balanced. For example if there is too much photoinitiator, the interior of the material will not cure effectively when exposed to light. If there is too little, the mixture will not absorb sufficient light to polymerize thoroughly on the surface or in the interior.

Although benzoyl peroxide and cumene hydroperoxide are essentially agents used for heat curing, it is believed that they participate in the polymerization to increase the temperature and solvent resistance, even if the sealant mixture has not been exposed to heat. The peroxides are believed to have their maximum effectiveness in the instant materials at approximately 60° C. (140° F.) Benzoyl peroxide and cumene hydroperoxide are also available from Aldrich Chemical. Similarly, it is believed that chain transfer agents such as pentaerythritol tetra(3-mercaptopropionate), PETMP, participate in the polymerization regardless of whether it is heat or light activated. PETMP is available from Evans Chemetics, Darien, Conn.

p-Methoxyphenol is added to the preferred embodiment as a stabilizer to prevent spontaneous polymerization. p-Methoxyphenol is available from Aldrich Chemical. Other stabilizers such as hydroquinone, phenothiazine, di-tert-butyl disulfide and the like as known in the art may also be used.

Fumed silica is added to control the rheological properties of the sealant. A hydrophobic grade is preferred. It is available from Degussa Corp., New York, N.Y., under the trade name Aerosil R-974. Another hydrophobic grade is available from Cabot Corp., Boston, Mass., under the name Cab-O-Sil N70-TS. Hydrophilic silica is less expensive but less desirable for sealants exposed to high humidities. It is available from Cabot Corp. as Cab-O-Sil M-5.

Figure 2:
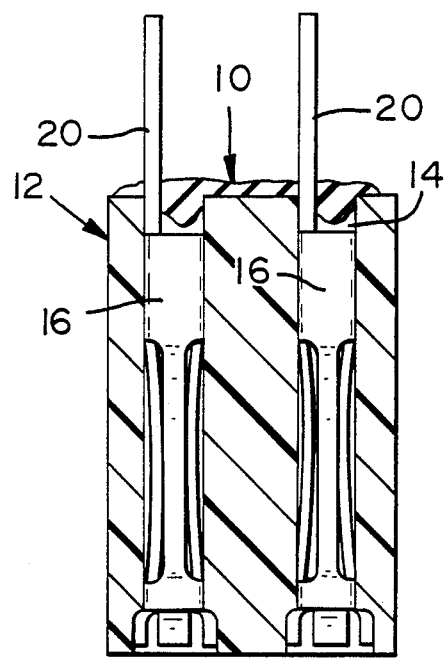
FIG. 2 is a cross-sectional view taken along the line 2—2 of FIG. 1.

FIGS. 1 and 2 show how the sealant composition 10 is used to seal selected portions of a typical box type electrical connector 12 and more specifically to fill and seal the apertures 14 which surround the electrical terminals 16 as they exit a connector housing 18. Terminals 16 are designed to have portions 20 which extend from the housing 18 at 14. After the terminals 16 have been inserted into the housing 18, a layer of composition 10 is deposited along the bottom surface 22 of the connector 12.

The amount of composition 10 used and the viscosity of the composition 10 are controlled so that the composition essentially does not flow from the surface 22 nor flow extensively into the apertures 14 as is shown in FIG. 2. The connector 12 having sealant composition 10 thereon is exposed to radiation means for 10 to 60 seconds which starts the initial cure and prevents the resultant hardened sealant from being wicked into the openings. A fixture may be used to hold the terminals during the curing stage. This will ensure that the terminals are in proper alignment for subsequent mounting of the connector on a circuit board. The sealant is sufficiently cured so that it will adhere to the dielectric housing as well as to the terminal members. The sealed connector may also be postcured by heat.

It is to be understood that the electrical connector shown in FIGS. 1 and 2 is a representative sample of the various electrical connectors and devices with which this sealant may be used. In addition to sealing selected locations and filling gaps as described above, the cured composition also strengthens the housing or device against physical stresses such as stress induced during subsequent bending and forming of terminals of DIP switches and the like.

The general method of photoirradiation curing the sealant is exposure to light radiated by mercury vapor lamps or halogen doped lamps with peak output at 210 to 450 nanometers (nm) for 3–60 seconds. The intensity is preferably on the order of 200 watts per inch of width. The optional heat post curing is conducted at 120°–150° C. (250°–300° F.) for 15–30 minutes. A two stage curing system is preferred because it permits a quick cure by exposure to actinic light and a slower cure by exposure to heat. It is desirable that the composition undergo curing as soon as possible after it is applied to the connector so that a minimum amount of sealant composition will enter the openings and flow into the connector where it could interfere with electrical interconnection with a mating connector.

The composition may be cured by a broad spectrum of actinic light which may be defined as electromagnetic radiation of wavelengths causing chemical changes, primarily 200 to 700 nanometers. Optionally, if heat alone is used, the heating time is increased by 15 minutes. The choice of photoinitiating system will determine the wavelength of light required. Heating by infrared radiation can be in the range of 700–1500 nm, visible light 400–700 nm preferably 400–550 nm, and ultraviolet, 200–400, preferably 290–400 nm. Irradiation by halogen doped bulbs which are rich in wavelengths from 350 to 450 nm is particularly effective. Fusion Systems Corporation, Rockville, MD supplies these under the designations Fusion Bulbs, type DH and V.

The following examples illustrate the invention and the ingredients are expressed in parts by weight except where specifically indicated otherwise.

EXAMPLE 1

Using the procedure described below, the following sealant curable by ultraviolet light and/or heat was mixed:

| | Ingredient | Parts by Weight |
|---|---|---|
| 1. | Vinyl ester resin[a] | 54.0 |
| 2. | Triethylene glycol dimethacrylate[b] | 36.9 |
| 3. | 2,2-dimethoxy-2-phenylacetophenone[c] | 01.8 |
| 4. | Fumed silica[d] | 06.0 |
| 5. | Benzoyl peroxide (30% water) | 01.0 |
| 6. | p-Methoxyphenol | 00.2 |

[a]Cargill 1570
[b]SR-205
[c]Irgacure 651
[d]Aerosil R-974

The above sealant composition was mixed by combining all the components except the vinyl ester resin and fumed silica. The resulting mixture was stirred at low turbulence for two hours until a clear, homogeneous solution was obtained. The vinyl ester resin was added, and the combination was stirred overnight. The mixture was inspected to ensure that were no lumps of gel or other second phases. Fumed silica was then added and mixed by an homogenizer until an ASTM D1210-64 test indicated a value of 8 NS.

This mixture was cured by ultraviolet light alone, by heat alone and by a combination of light and heat. When heat was used as the sole method of curing, the heating time was extended to 15 minutes.

EXAMPLE 2

Using the same procedure of Example 1, the following sealant curable by any combination of ultraviolet light, visible light and heat is mixed.

| No. | Component | Parts By Weight |
|---|---|---|
| 1. | Vinyl ester resin[a] | 54.0 |
| 2. | Triethylene glycol dimethacrylate[b] | 33.3 |
| 3. | 2,2-dimethoxy-2-phenylacetophenone[c] | 1.8 |
| 4. | 1-Hydroxycyclohexyl phenyl ketone[d] | 1.8 |
| 5. | d,l-Camphoroquinone | 1.8 |
| 6. | Benzoyl peroxide (30% water) | 1.0 |
| 7. | p-Methoxyphenol | 0.2 |
| 8. | Fumed silica[e] | 6.0 |

[a]Cargill 1570
[b]SR-205
[c]Irgacure 651
[d]Irgacure 184
[e]Aerosil R-974

EXAMPLE 3

Using the same procedure of Example 1, the following sealant curable by ultraviolet light and/or heat was compounded.

| No. | Component | Parts by Weight |
|---|---|---|
| 1. | Vinyl ester resin[a] | 60.0 |
| 2. | Triethylene glycol dimethacrylate[b] | 41.0 |
| 3. | 2,2-dimethoxy-2-phenylacetophenone[c] | 1.0 |
| 4. | Benzoyl peroxide (30% water) | 0.8 |
| 5. | p-Methoxyphenol | 0.2 |

[a]Epocryl 370
[b]SR-205
[c]Irgacure 651

EXAMPLE 4

The following compositions were prepared to overcome the undesirable surface tack of the adhesive sealant of Example 1.

The indicated concentrations of pentaerythritol tetra(3-mercaptopropionate) (PETMP) were stirred into the adhesive sealant of Example 1. The compounds were rated by a tactile tack test with a rating of 1 signifying very tacky to 10 signifying no tack.

| Compound No. | % By Wt. PETMP | Tack Rating |
| --- | --- | --- |
| C (control) | 0 | 2 |
| 1 | 1 | 4 |
| 2 | 5 | 7 |
| 3 | 10 | 10 |

EXAMPLE 5

Example 4 was repeated to ascertain whether PETMP could substitute completely for benzoyl peroxide in the adhesive sealant of Example 1. The adhesive sealant was prepared omitting benzoyl peroxide, and the procedure of Example 5 was followed.

| Compound No. | % By Wt. PETMP | Tack Rating |
| --- | --- | --- |
| C (control) | 0 | 2 |
| 1 | 1 | 4 |
| 2 | 5 | 7 |
| 3 | 10 | 10 |
| 4 | 20 | 10 |

EXAMPLE 6

Using the procedure of Example 1, the following adhesive sealant composition hardenable by actinic and/or thermal radiation were prepared.

| No. | Ingredient | Formulation A Parts by Weight | Formulation B Parts by Weight |
| --- | --- | --- | --- |
| 1. | PETMP | 10 | 15 |
| 2. | Vinyl ester resin[a] | 50 | 48 |
| 3. | Triethylene glycol dimethacrylate[b] | 31.1 | 28.1 |
| 4. | 2,2-dimethoxy-2 phenylacetophenone[c] | 1.8 | 1.8 |
| 5. | Fumed silica[d] | 5.9 | 5.9 |
| 6. | p-Methoxyphenol | 0.2 | 0.2 |

[a]Cargill 1570
[b]SR-205
[c]Irgacure 651
[d]Aerosil R-974

The shelf life of the formulation in amber glass containers was greater than two months under ambient room conditions. The compounds polymerized in less than 30 seconds, formulation B exhibiting a tack rating of 10 compared to the barely detectable tack (9) of formulation A. Formulation B when tested by procedure ASTM D790-71 of the American Society for Testing Materials exhibited a flexural modulus of 20,029 psi. vs. 13,240 psi for the adhesive sealant of Example 1.

Samples of Formulation A when placed on glass microscope slides and exposed independently to ultraviolet, visible, and thermal energy sources all hardened to infusible, insoluble masses.

EXAMPLE 7

Using the procedure of Example 1, the following composition hardenable by actinic light was prepared.

| No. | Ingredient | Parts by Weight |
| --- | --- | --- |
| 1. | Vinyl ester resin[a] | 1 |
| 2. | N-vinyl-2-pyrrolidinone[b] | 6 |
| 3. | Dipentaerythritol monohydroxypentaacrylate[c] | 20 |
| 4. | 1,6-Hexanediol diacrylate | 13 |
| 5. | 1-Hydroxycyclohexyl phenyl ketone[d] | 5 |
| 6. | Fumed silica[e] | 5.5 |

[a]Cargill 1570
[b]GAF Corp.
[c]SR-399
[d]Irgacure 184
[e]Aerosil R-974

The viscosity of the composition is measured using a Brookfield Viscosimeter, Model RVT and a #6 spindle at 23.5° C. An average of 5, 10, and 20 rpm readings is approximately 50,000 centipoises.

When applied to a glass reinforced polybutylene terephthalate housing and exposed 5 seconds to the radiation from a 95 watts per inch non-mercury bulb (Fusion Systems Corp. "D" bulb), the adhesive sealant cures to a hard, non-tacky surface. However, the adhesion to the housing is only moderate, and the sealed switches do not meet the requirements for complete bottom sealing of DIP Switches.

EXAMPLE 8

Example 7 was repeated including 6 parts by weight of a non-polymerizable polyester resin (Vitel VEP-58331). The concentration of the vinyl ester resin was reduced by the same proportion.

The Brookfield viscosity of the composition measured under the same conditions described in Example 7 was again approximately 50,000 centipoises.

The sealant composition was prepared by combining N-vinyl-2-pyrrolidinone, 2.4% of the 1,6-hexanediol diacrylate, and the Vitel VPE-5833A polyester copolymer resin in a stirred vessel. To expedite the dissolution of the polyester copolymer resin, the resin was added incrementally and the solution was warmed to 40° C., under reflux.

The initiator, Irgacure 184, was dissolved in the remainder of 1,6-hexanediol diacrylate and the crosslinking monomer SR-399. When the Vitel VPE-5833A was dissolved, the solution was cooled and added to the initiator solution. The blend was mixed, when the vinyl ester resin was added and mixed until homogeneous.

Finally, the fumed silica was added and mixed under vacuum with a high shear dispersing blade until the silica was thoroughly dispersed.

When applied to a glass reinforced polybutylene terephthalate (PBT) housing and exposed 5 seconds to the condition from a 95 microinches non-mercury bulb (Fusion Systems Corp. "A" bulb) the adhesive/sealant cures to a hard non-tacky surface. Compared to Example 7, adhesion to the PBT housing is significantly improved.

EXAMPLE 9

Using the procedure described below, the following adhesive sealant curable by actinic light and/or heat was mixed:

| No. | Ingredient | Parts by Weight |
|---|---|---|
| 1. | Vinyl ester resin[a] | 54.0 |
| 2. | Copper II pentadionate | 00.5 |
| 3. | Triethylene glycol dimethacrylate[b] | 36.9 |
| 4. | N-methyldiethanolamine | 01.0 |
| 5. | 2,2-dimethoxy-2-phenylacetophenone[c] | 01.8 |
| 6. | Fumed silica[d] | 06.0 |
| 7. | d,l-Camphoroquinone | 00.5 |
| 8. | Benzoyl peroxide (30% water) | 01.0 |
| 9. | p-Methoxyphenol | 01.0 |

[a]Cargill 1570
[b]SR-205
[c]Irgacure 651
[d]Aerosil R-974

The above sealant composition was mixed by combining ingredients 3, 5, 8 and 9. The resulting mixture was stirred at low turbulence for about two hours until a clear, homogeneous solution was obtained. Ingredient 1 was added, and the combination was stirred overnight. The mixture was inspected to insure there were no lumps of gel or other second phases. Ingredient 6 was then added and mixed by an homogenizer until an ASTM D1210-64 test indicated a value of 8NS. Ingredients 2, 7 and 4 were added in order immediately before use, stirring until no more color change was visible to ensure uniform dispersion.

EXAMPLE 10

The adhesive sealant of example 9 was coated onto a glass microscope slide and a second microscope slide was pressed onto it to achieve a coating about 2 to 4 millimeters thick. The assembly was exposed one minute to sunlight. The sealant hardened completely with strong adhesion to the glass.

EXAMPLE 11

Example 10 was repeated using a 4 second exposure to a mercury vapor lamp of 200 watts per inch intensity. The adhesive hardened completely with adhesion sufficiently strong to render the slides inseparable without breakage.

EXAMPLE 12

The adhesive sealant of Example 9 was placed in an aluminum weighing dish in the form of a puddle of sealant 5 centimeters in diameter and 2 millimeters deep. The weighing dish was placed into an air circulating oven in the dark at 60° C. overnight. The sealant only thickened, indicating the need for a higher concentration of thermal curing agent for polymerization exclusively by heat. The experiment was repeated using a concentration of 0.5% benzoyl peroxide whereupon the composition hardened to an infusible, insoluble mass.

EXAMPLE 13

The adhesive sealant composition of Example 9 was applied to the base of an electrical connector with a poly(phenylene sulfide) housing in which gold plated electrical contacts were mounted. The interstices between the housing and the contacts were approximately 3 millimeters wide. The sealant flowed and leveled to a plug approximately 0.003 inches deep around the contact legs. The assembly was exposed 4 seconds to a mercury vapor lamp at 200 watts per inch intensity. Subsequent testing by a solution of fluorescent dye showed complete sealing of the assembly.

EXAMPLE 14

Example 13 is repeated using the adhesive sealant composition of Example 9 with 15% by weight pentaerythritoltetra(3-mercapto-propionate) substituted for the benzoyl peroxide, the other ingredients being reduced proportionately. After an overnight exposure to 60° C. in an air circulating oven subsequent testing indicated complete sealing with strong adhesion to the gold surfaced contacts.

EXAMPLE 15

Example 9 was repeated using exposure to ordinary room light consisting of cool white fluorescent lighting. The composition was observed after standing two days on the bench top and was observed to be completely hardened.

EXAMPLE 16

The composition of Example 9 may be compounded omitting ingredients 2, 4 and 7. Connectors may be sealed as in Example 14 and cured by exposure to sunlight, ultraviolet light, visible room light, and heat alone. The sealant hardens completely when irradiated by ultraviolet light, sunlight, and heat but only partially hardens (gels) when exposed to visible light alone.

EXAMPLE 17

Using the procedures described below, the following sealant curable by ultraviolet light and/or heat and/or visible light was prepared.

| | Ingredients | Parts by Weight |
|---|---|---|
| 1. | Vinyl ester resin[a] | 48.0 |
| 2. | Triethylene glycol dimethacrylate[b] | 36.9 |
| 3. | 2,2-dimethoxy-2-phenylacetophenone[c] | 1.8 |
| 4. | Pentaerylthritol tetra-(3-mercaptopropionate)[d] | 15.0 |
| 5. | p-Methoxyphenol | 0.1 |
| 6. | Fumed silica[e] | 6.0 |

[a]Cargill 1570
[b]SR-205
[c]Irgacure 651
[d]PETMP
[e]Aerosil R-974

All the components except the vinyl ester resin and fumed silica were combined simultaneously. The resulting mixture was stirred at low turbulance for two hours until a clear, homogeneous solution was obtained. The vinyl ester was added and the combination was stirred for one hour. The fumed silica was then added and mixed by an homogenizer until an ASTM D1210-64 test indicated a value of 8N5.

This mixture was cured by ultraviolet light alone, by heat alone, by visible light alone and by a combination of ultraviolet light and visible light followed by heating.

EXAMPLE 18

Using the ingredients and procedure of example 9, formulations A and B were compounded and subjected to a curing efficiency test.

| A | | B | |
|---|---|---|---|
| Ingredient Number | Parts by Weight | Ingredient Number | Parts by Weight |
| 1 | 58.9 | 1 | 57.4 |
| 3 | 38.0 | 3 | 38.0 |
| 5 | 03.0 | 5 | 03.0 |

-continued

| A | | B | |
|---|---|---|---|
| Ingredient Number | Parts by Weight | Ingredient Number | Parts by Weight |
| 9 | 00.1 | 9 | 00.1 |
| | | 1-hydroxycyclohexyl phenol ketone[a] | 01.5 |

[a]Irgacure 184

Formulation B exhibited an improved curing efficiency for which the combined photoinitiators were responsible.

Depth of Cure (inches) (30 sec under UV lamp/200 watts/inch)

| Depth of Cure (in inches) | Circumference (Inches) | | |
|---|---|---|---|
| | (0.25) | (0.188) | (0.125) |
| A | 0.28 | 0.34 | 0.44 |
| B | 0.38 | 0.41 | 0.44 |

EXAMPLE 19

Using the same procedure of Example 1, the following sealant curable by any combination of ultraviolet light, visible light and heat was mixed.

| No. | Component | Parts By Weight |
|---|---|---|
| 1. | Vinyl ester resin[a] | 60 |
| 2. | Triethylene glycol dimethacrylate[b] | 30 |
| 3. | Trimethylol propane triacrylate | 7 |
| 4. | 2,2-dimethoxy-2-phenylacetophenone[C] | 2.2 |
| 5. | p-Methoxyphenol | 0.025 |
| 6. | N-Methyl diethanolamine | 0.8 |

[a]Cargill 1570
[b]SR-205
[c]Irgacure 651

After deaeration and standing overnight in the dark at 40° F., the adhesive sealant was allowed to warm to room temperature (23° C.). Its Brookfield viscosity was 2500 centipoises.

Electrical connectors molded from glass reinforced polybutylene terephthalate resin were sealed by applying 2 mm layers of the sealant to the orifices and gaps and exposing the connectors for 15 seconds to ultraviolet light from a mercury vapor lamp of 200 watts per inch intensity.

EXAMPLE 20

Using the procedure described below, the following sealant curable by ultraviolet light and/or heat was mixed:

| No. | Ingredient | Parts by Weight |
|---|---|---|
| 1. | Vinyl ester resin[a] | 54.2 |
| 2. | Triethylene glycol dimethacrylate[b] | 37.0 |
| 3. | 2,2-dimethoxy-2 phenylacetophonone[c] | 1.8 |
| 4. | Fumed silica[d] | 5.9 |
| 5. | Benzoyl Peroxide (30% water) | .73 |
| 6. | p-Methoxyphenol | .3 |

[a]Cargill 1570
[b]SR-205
[c]Irgacure 651
[d]Aerosil R-974

The above sealant composition was mixed by first preparing a premix of 71.6% by weight vinyl ester resin and 28.4% by weight triethylene glycol dimethacrylate. The resulting mixture was stirred using low agitation for about one hour until a clear, homogeneous solution was observed.

Triethylene glycol dimethacrylate, 154 g, was placed in a stainless steel beaker. The p-methoxyphenol (3.0 g), 2,2-dimethoxy-2-phenylacetophonone (18 g) and the benzoyl peroxide (7.3 g) were added to the beaker. The components were mixed using low agitation for one hour until a clear homogeneous solution was obtained. The premix (757 g.) was added to the beaker and mixed with low agitation for one hour. The fumed silica (59 g) was then added and mixed by a homogenizier for five minutes. The mixture was then degassed for one minute at 29 inches vacuum to remove gross air entrapment.

This mixture was cured by ultraviolet light alone, by heat alone and by combination of light and heat.

EXAMPLE 21

Using the procedure described below, the following sealant hardenable by ultraviolet light and/or heat may be compounded.

| No. | Component | Parts By Weight |
|---|---|---|
| 1. | Vinyl ester resin[a] | 53.5 |
| 2. | Tripropylene glycol dimethacrylate[b] | 36.6 |
| 3. | 2,2-dimethoxy-2-phenylacetophenone[c] | 1.9 |
| 4. | Fumed silica[d] | 6.8 |
| 5. | Benzoyl peroxide (30% water) | 1.0 |
| 6. | p-Methoxyphenol | 0.2 |

[a]Cargill 1570
[b]SR-205
[c]Irgacure 651
[d]Aerosil R-974

The above sealant composition is mixed by combining all the components except the vinyl ester resin and fumed silica. The reslting mixture is stirred at low turbulence for about two hours until a clear, homogeneous solution is obtained. The vinyl ester resin is added, and the combination is stirred overnight. The mixture is inspected to ensure there are no lumps of gel or other second phases. Fumed silica is then added and mixed by an homogenizer until an ASTM D1210-64 test indicates a value of 8NS.

This mixturee may be cured by ultraviolet light alone, or by heat alone or by a combination of light and heat. When heat is used as the sole method of curing, the heating time is extended by 15 minutes.

EXAMPLE 22

The method of example 20 was used to prepare and compare the effect of minor modifications of ingredient concentrations on application viscosity and sealing effectiveness.

| No. | Material Formulation: | Parts by weight A | Parts by weight B | Parts by weight C |
|---|---|---|---|---|
| 1. | Vinyl ester resin[a] | 53.5 | 54.0 | 54.4 |
| 2. | Triethylene glycol dimethacrylate | 36.6 | 36.9 | 37.2 |
| 3. | 2,2-dimethoxy-2-phenylacetophenone[b] | 1.9 | 1.8 | 1.7 |
| 4. | Benzoyl peroxide | 1.0 | 1.0 | 1.0 |
| 5. | p-Methoxyphenol | 0.2 | 0.2 | 0.2 |

| No. | Material Formulation: | Parts by weight A | Parts by weight B | Parts by weight C |
|---|---|---|---|---|
| 6. | Fumed silica[c] | 6.8 | 6.0 | 5.4 |
| | Brookfield Viscosity (Spindle #5 (.5 rpm) | 480,000 cps | 128,000 cps | 56,000 cps |

[a]Cargill 1570
[b]SR-205
[c]Irgacure 651

In a functional ultraviolet curing test all three formulations hardened in less than 30 seconds when exposed to the radiation from a mercury vapor lamp of 200 watts per inch intensity.

Functional trials in which A, B, and C were all dispensed from a 21 gauge needle using 60 psi air pressure confirmed that formulation B had the optimum combination of flow, wetting and leveing in the orifices of an electrical connector molded from polyphenylene sulfide and containing gold plated contacts. Ten connectors were sealed with formulation B by exposing the applied sealant for 60 seconds to a 200 watt per inch lamp followed by heating for 90 minutes at 275° F. and less than 20 mm of mercury pressure. All connectors withstood subsequent exposure to an electrosonic cleaning unit, the vapors of which were at 44.7° C., the solvent of which was Freon TF, DuPont Co., composed of 90.3% fluorocarbon, 9.4% acetone, 0.3% nitropropane. No leakage occurred.

EXAMPLE 23

Using the procedure described in Example 1, the following adhesive sealant hardenable by actinic light was compounded.

| Formulation: Ingredients No. | Material | Parts by Weight |
|---|---|---|
| 1. | Acrylated polyester urethane[a] | 1134 |
| 2. | N-vinyl-2-pyrrolidinone[b] | 483 |
| 3. | Dipentaerythritol monohydroxypenta-acrylate[c] | 483 |
| 4. | 1-hydroxycyclohexyl phenyl ketone[d] | 105 |
| 5. | Fumed silica[e] | 35.9 |

[a]Uvithane 782
[b]GAF Corp.
[c]SR-399
[d]Irgacure 184
[e]Aerosil R-974

After mixing the compound was deaerated by a vacuum of 20 mm actual pressure at 23° C. for one hour and allowed to equilibrate for five hours at 23° C.

The stability of the viscosity was measured using a Brookfield RVT Viscosimeter using a #6 spindle at 50 rpm. The five hours after viscosity was 15,000 centipoises. One day later the viscosity had increased only to 18,000 centipoises.

Curing by a mercury vapor lamp of 200 watts per inch occurred within 10 seconds.

EXAMPLE 24

Using the procedure of example 23, the following adhesive sealant hardenable by actinic light was compounded.

| Formulation Ingredients No. | Materials (1) | Parts by Weight |
|---|---|---|
| 1. | Acrylated polyester urethane[a] | 54 |
| 2. | N-vinyl-2-pyrrolidinone[b] | 30 |
| 3. | Dipentaerythritol monohydroxypenta-acrylate[c] | 16 |
| 4. | 1-hydroxycyclohexyl phenyl ketone[d] | 0.2 |
| 5. | 2,2-dimethoxy-2-phenylacetophenone[e] | 0.12 |

[1a]Uvithane 782
[b]GAF Corp.
[c]SR-399
[d]Irgacure 184
[e]Irgacure 651

The formulation and a contemporary sealant of similar viscosity (ca. 10,000 cp.) were applied to electrical connectors having glass reinforced polyester housings and gold plated contacts. After irradiation side by side under a mercury vapor lamp of 200 watts per inch for 5 seconds, the formulation had hardened, and its surface was functionally tack-free. The contemporary sealant had a functionally tacky surface.

EXAMPLE 25

Using the procedure of Example 23, the following adhesive sealants hardenable by actinic light were compounded:

| Formulations: | Parts by Weight A | Parts by Weight B | Parts by Weight C |
|---|---|---|---|
| Acrylated polyester urethane[50] | A | 50 | 50 |
| N-vinyl-2-pyrrolidinone[b] | 26 | 26 | 26 |
| Dipentaerythritol monohydroxy-pentaacrylate[c] | 24 | 24 | 24 |
| Fumed silica[d] | 4.8 | 4.8 | 4.8 |
| 1-hydroxycyclohexyl phenyl ketone[e] | 4 | 0 | 3.5 |
| 2,2-dimethoxy-2-phenylacetophenone[f] | 0 | 0 | 1.5 |

[a]Uvithane 782
[b]GAF Corp.
[c]SR-399
[d]Aerosil 184
[e]Irgacure 184
[f]Irgacrue 651

After storage overnight in the dark at 23° C., the sealants were applied to switches as in example 24. None of the sealant formulations sagged significantly into the contact foramens. When exposed 15 seconds to the light source of example 23, formulation B remained unhardened and wet. Both A and C were completely hardened with tack-free surfaces.

EXAMPLE 26

Using the procedure described in Example 1, the following adhesive sealant hardenable by actinic light was compounded.

| Formulation: Ingredient No. | Material | Parts by Weight |
|---|---|---|
| 1. | Acrylated polyester urethane[a] | 1134 |
| 2. | N-vinyl-2-pyrrolidinone[b] | 483 |
| 3. | Dipentaerythritol monohydroxy-pentaacrylate[c] | 483 |
| 4. | 1-Hydroxycyclohexyl phenyl ketone[d] | 105 |
| 5. | Fumed silica[e] | 42 |

| Formulation: Ingredient No. | Material | Parts by Weight |
|---|---|---|
| 6. | Benzoyl peroxide (30% water) | 15.75 |

[a] Uvithane 782
[b] GAF Corp.
[c] SR-399
[d] Irgacure 184
[e] Aerosil R-974

After mixing the compound was deaerated by a vacuum of 20 mm actual pressure at 23° C., for one hour and allowed to equilibrate for 5 hours at 23° C.

EXAMPLE 27

Using the procedure of Example 1, the following adhesive sealants hardenable by visible actinic light were compounded.

| Material | Parts By Weight |
|---|---|
| Formulation A: | |
| 1. Acrylated polyester urethane[a] | 67.25 |
| 2. N-vinyl-2-pyrrolidinone[b] | 29 |
| 3. d,l-camphoroquinone | 0.25 |
| 4. N-methyl-diethanolamine | 2.5 |
| 5. 2,2-dimethoxy-2-phenylacetophenone[c] | 1.0 |
| Formulation B: | |
| 1. Acrylated polyester urethane[a] | 64.25 |
| 2. N-vinyl-2-pyrrolidinone[b] | 27 |
| 3. d,l-camphoroquinone | 0.25 |
| 4. N-methyl-diethanolamine | 2.5 |
| 5. 2,2-diemthoxy-2-phenylacetophenone[c] | 1.0 |
| 6. Methacrylic aicd | 5 |

[a] Uvithane 782
[b] GAF Corp.
[c] Irgacure 651

When tested as in Example 10, 11 and 15, formulations A, and B were hardened completely after an exposure to the radiation of a tungsten floodlight.

The foregoing examples illustrate the invention. They are not to be construed as limitations on the instant invention except as indicated in the appended claims.

What is claimed is:

1. A dielectric composition useful as a sealant material for electrical and electro-optical devices upon polymerization thereof, said composition being comprised of:

a major proportion of at least one polymerizable oligomeric compound capable of being polymerized by electromagnetic radiation, said at least oligomeric compound being selected from the group consisting of 2,2-bis[4-(2-hydroxy-3-acryloxypropoxy)phenyl]propane, 2,2-bis[4-(2-hydroxy-3-methacryloxypropoxy)phenyl]propane, acrylated urethane oligomers and combinations thereof;

a minor proportion of at least one polymerizable acrylic diluent monomer, said at least one diluent monomer being selected from the group consisting of triethylene glycol dimethacrylate, triethylene glycol diacrylate, 1,6-hexanediol diacrylate, tripropylene glycol diacrylate, tripropylene glycol dimethacrylate, methacrylic acid, allyl methacrylate, 1-vinyl-2-pyrrolidinone, tetraethylene glycol dimethacrylate, dipentaerythritol monohydroxypentaacrylate, trimethylol-pressure trimethacrylate, and combinations thereof; and a polymerization activation system comprising from about 0.25% to about 17% by weight of the resin, said system including at least one photopolymerization initiator and at least one material capable of initiating a thermal polymerization, said at least one photopolymerization initiator being selected from the group consisting of 1-hydroxycyclohexyl phenyl ketone, d,1-camphoroquinone, benzoquinone, benzophenone, 1,4-naphthoquinone, 2,2-dimethoxy-2-phenylacetophenone, triethanolamine, N-methyldiethanolamine, benzoin ethers (methyl, ethyl and isobutyl) and combinations thereof; and said at least one material capable of initiating a thermal polymerization is selected from the group consisting of benzoyl peroxide, cumene hydroperoxide, and combinations thereof; whereby upon a selected amount of said composition being applied to desired areas of an electrical or electro-optical device and being exposed to electromagnetic radiation selected to activate said polymerization activation system, said composition is polymerized to a sealant material that is resistant to solder and solvents and excludes solder and solvents from the device at said selected areas.

2. A dielectric composition useful upon polymerization thereof in electrical connectors that will be soldered to a substrate, said connectors being comprised of a housing means and a plurality of electrical terminal members extending therefrom, said composition comprising:

a major proportion of at least one polymerizable oligomeric compound capable of being polymerized by electromagnetic radiation, said at least oligomeric compound being selected from the group consisting of 2,2-bis[4-(2-hydroxy-3-acryloxypropoxy)phenyl]propane, 2,2-bis[4-(2-hydroxy-3-methacryloxypropoxy)phenyl]propane, acrylated urethane oligomers and combinations thereof;

a minor proportion of at least one polymerizable acrylic diluent monomer, said at least one diluent monomer being selected from the group consisting of triethylene glycol dimethacrylate, triethylene glycol diacrylate, 1,6-hexanediol diacrylate, tripropylene glycol diacrylate, tripropylene glycol dimethacrylate, methacrylic acid, allyl methacrylate, 1-vinyl-2-pyrrolidinone, tetraethylene glycol dimethacrylate, dipentaerythritol monohydroxypentaacrylate, trimethylol-propane trimethacrylate, and combinations thereof; and a polymerization activation system comprising from about 0.25% to about 17% by weight of the resin, said system including at least one photopolymerization initiator and at least one material capable of initiating a thermal polymerization, said at least one photopolymerization initiator being selected from the group consisting of 1-hydroxycyclohexyl phenyl ketone, d,1-camphoroquinone, benzoquinone, benzophenone, 1,4-naphthoquinone, 2,2-dimethoxy-2-phenylacetophenone, triethanolamine, N-methyldiethanolamine, benzoin ethers (methyl, ethyl and isobutyl) and combinations thereof; and said at least one material capable of initiating a thermal polymerization is selected from the group consisting of benzoyl peroxide, cumene hydroperoxide, and combinations thereof; whereby upon a selected amount of said composition being applied to desired areas of an electrical or electro-optical device and being exposed to electromagnetic radiation selected to activate said polymerization activation system, said composition is polymerized to a sealant material that is resistant to solder and solvents and excludes solder and solvents from the device at said selected areas.

3. The dielectric composition as set forth in claim 1 wherein said polymerization activation system further includes at least one chain transfer agent.

4. The dielectric composition as set forth in claim 3 wherein said chain transfer agent is pentaerythritol tetra-(3-mercaptopropionate).

5. The dielectric composition as set forth in claim 1 further including at least one polymerization copromoter selected from the group consisting of copper 2,4-pentanedionate, cobalt octoate, other salts and chelates of copper and cobalt, triethanolamine and N-methyl-diethanolamine and combinations thereof.

6. The dielectric composition as set forth in claim 1 further comprised of at least one polymerization stabilizer.

7. The dielectric composition as set forth in claim 6 wherein said at least one polymerization stabilizer selected from the group consisting of p-methoxyphenol, hydroquinone, phenothiazine, di-tert-butyl disulfide, and combinations thereof.

8. The dielectric composition as set forth in claim 2 wherein said polymerization activation system further includes at least one chain transfer agent.

9. The dielectric composition as set forth in claim 8 wherein said chain transfer agent is pentaerythritol tetra-(3-mercaptopropionate).

10. The dielectric composition as set forth in claim 2 further including at least one polymerization copromoter selected from the group consisting of copper 2,4-pentanedionate, cobalt octoate, other salts and chelates of copper and cobalt, triethanolamine and N-methyl-diethanolamine and combinations thereof.

11. The dielectric composition as set forth in claim 2 further comprised of at least one polymerization stabilizer.

12. The dielectric composition as set forth in claim 11 wherein said at least one polymerization stabilizr selected from the group consisting of p-methoxyphenol, hydroquinone, phenothiazine, di-tert-butyl disulfide, and combinations thereof.

* * * * *